(12) United States Patent
Achard et al.

(10) Patent No.: US 10,342,160 B2
(45) Date of Patent: *Jul. 2, 2019

(54) HEAT SINK ATTACHMENT ON EXISTING HEAT SINKS

(71) Applicant: International Business Machines Corporation, Armonk, NY (US)

(72) Inventors: Louis-Marie Achard, Granby (CA); Kenneth C. Marston, Poughquag, NY (US); Janak G. Patel, South Burlington, VT (US); David L. Questad, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/802,560

(22) Filed: Nov. 3, 2017

(65) Prior Publication Data
US 2018/0054915 A1    Feb. 22, 2018

Related U.S. Application Data

(63) Continuation of application No. 14/728,502, filed on Jun. 2, 2015, now Pat. No. 9,883,612.

(51) Int. Cl.
*H05K 7/20* (2006.01)
*H01L 23/367* (2006.01)
*H01L 23/40* (2006.01)

(52) U.S. Cl.
CPC ......... *H05K 7/2039* (2013.01); *H01L 23/367* (2013.01); *H01L 23/4006* (2013.01); *H05K 7/20409* (2013.01)

(58) Field of Classification Search
CPC .............. H05K 7/2039; H05K 7/20409; H01L 23/367; H01L 23/4006
See application file for complete search history.

(56) References Cited

U.S. PATENT DOCUMENTS 3,213,324 A    10/1965    McAdam
4,177,499 A    12/1979    Volkmann
(Continued)

FOREIGN PATENT DOCUMENTS

CN    2807480    8/2006
EP    1 524 691 A2    4/2005
(Continued)

OTHER PUBLICATIONS

U.S. Appl. No. 14/728,502, Office Action Communication dated Sep. 26, 2016, 26 Pages.
(Continued)

*Primary Examiner* — James Wu
*Assistant Examiner* — Michael A Matey
(74) *Attorney, Agent, or Firm* — Michael O'Keefe (57) ABSTRACT

Structures and methods for providing heat sink attachments on existing heat sinks. According to a device, a first heat sink comprises a first base and fins extending from the first base. The first base comprises a cutout therein and a first base bottom surface contacting a first electronic component. A second heat sink comprises a second base and fins extending from the second base. The second heat sink is located in the cutout of the first heat sink. The second base comprises a second base bottom surface contacting a second electronic component. A pressure plate is attached to the first heat sink and overlays the second heat sink. The pressure plate contacts the second heat sink and applies pressure between the second heat sink and the second electronic component.

20 Claims, 5 Drawing Sheets

(56) References Cited

U.S. PATENT DOCUMENTS

| | | | |
|---|---|---|---|
| 4,552,206 A | 11/1985 | Johnson et al. | |
| 5,202,943 A | 4/1993 | Carden et al. | |
| 5,384,940 A | 1/1995 | Soule et al. | |
| 5,399,858 A | 3/1995 | Kinoshita | |
| 5,662,163 A | 9/1997 | Mira | |
| 5,845,031 A | 12/1998 | Aoki | |
| 5,913,108 A | 6/1999 | Stephens et al. | |
| 5,924,290 A | 7/1999 | Yoshino | |
| 6,072,814 A | 6/2000 | Ryan et al. | |
| 6,097,601 A | 8/2000 | Lee | |
| 6,107,711 A | 8/2000 | Borchert | |
| 6,155,724 A | 12/2000 | Ichino et al. | |
| 6,223,815 B1 | 5/2001 | Shibasaki | |
| 6,229,705 B1 | 5/2001 | Lee | |
| 6,377,463 B1 | 4/2002 | Shah | |
| 6,483,704 B2 | 11/2002 | Ulen et al. | |
| 6,532,141 B1 | 3/2003 | Wu | |
| 6,538,889 B1 * | 3/2003 | Barsun | H01L 21/4871 165/185 |
| 6,661,665 B2 | 12/2003 | Tantoush et al. | |
| 6,757,179 B2 | 6/2004 | Barsun et al. | |
| 6,807,061 B1 | 10/2004 | Harris | |
| 6,916,122 B2 | 7/2005 | Branch et al. | |
| 6,922,340 B2 | 7/2005 | Belady et al. | |
| 6,936,919 B2 | 8/2005 | Chuang et al. | |
| 6,958,915 B2 | 10/2005 | Wang et al. | |
| 6,992,895 B2 | 1/2006 | Lindberg | |
| 7,057,896 B2 | 6/2006 | Matsuo et al. | |
| 7,193,849 B2 | 3/2007 | Xu et al. | |
| 7,209,354 B2 | 4/2007 | Wu et al. | |
| 7,224,582 B1 | 5/2007 | Saturley et al. | |
| 7,333,342 B2 | 2/2008 | Saito | |
| 7,345,879 B2 * | 3/2008 | Chen | H01L 21/4882 165/185 |
| 7,371,965 B2 | 5/2008 | Ice | |
| 7,375,965 B2 | 5/2008 | Xia et al. | |
| 7,405,931 B2 | 7/2008 | Saturley et al. | |
| 7,462,934 B2 | 12/2008 | Reents | |
| 7,544,527 B2 | 6/2009 | Benner et al. | |
| 7,667,970 B2 * | 2/2010 | Ma | H01L 23/3672 361/704 |
| 7,746,647 B2 | 6/2010 | Guo et al. | |
| 7,746,653 B2 | 6/2010 | Negrut | |
| 7,786,555 B2 | 8/2010 | Xiaochun | |
| 7,952,262 B2 | 5/2011 | Wilcox et al. | |
| 8,513,866 B2 | 8/2013 | Breidenassel et al. | |
| 8,797,744 B2 | 8/2014 | Cawthon et al. | |
| 9,207,023 B2 | 12/2015 | Koplow | |
| 2002/0110165 A1 | 8/2002 | Filgas | |
| 2002/0137369 A1 * | 9/2002 | Edwards | H05K 7/1061 439/77 |
| 2006/0056153 A1 | 3/2006 | Lopatinsky et al. | |
| 2006/0285297 A1 * | 12/2006 | Conner | H01L 23/4006 361/710 |
| 2007/0147000 A1 | 6/2007 | Kuo | |
| 2007/0217161 A1 | 9/2007 | Wu et al. | |
| 2008/0068805 A1 * | 3/2008 | Xu | H01L 23/4093 361/710 |
| 2008/0266806 A1 | 10/2008 | Lakin et al. | |
| 2009/0086481 A1 | 4/2009 | Wegner | |
| 2009/0236626 A1 | 9/2009 | Xiao et al. | |
| 2013/0301275 A1 | 11/2013 | Kim | |
| 2014/0085824 A1 * | 3/2014 | Wavering | H01L 23/3735 361/701 |
| 2014/0133101 A1 | 5/2014 | Sunga et al. | |
| 2014/0216703 A1 | 8/2014 | Yi et al. | |
| 2015/0013956 A1 | 1/2015 | Yoshizumi et al. | |
| 2015/0062827 A1 * | 3/2015 | Aizawa | H05K 7/2049 361/720 |
| 2015/0243609 A1 * | 8/2015 | Lamorey | H01L 23/642 361/717 |

FOREIGN PATENT DOCUMENTS

| | | |
|---|---|---|
| EP | 2 730 837 A1 | 5/2014 |
| WO | 2003026084 A1 | 3/2003 |
| WO | 2007067954 A2 | 6/2007 |

OTHER PUBLICATIONS

U.S. Appl. No. 14/728,502, Office Action Communication dated Mar. 23, 2017, 16 Pages.

U.S. Appl. No. 14/728,502, Advisory Action dated Jun. 15, 2017, 6 Pages.

U.S. Appl. No. 14/728,502, Notice of Allowance dated Sep. 18, 2017, 9 Pages.

* cited by examiner

HEAT SINK ATTACHMENT ON EXISTING HEAT SINKS

CROSS-REFERENCE TO RELATED APPLICATIONS

The present invention claims the benefit under 35 U.S.C. § 120 as a continuation of U.S. patent application Ser. No. 14/728,502 filed on Jun. 2, 2015, now U.S. Pat. No. 9,883,612, issued on Jan. 30, 2018, the entire teachings of which are incorporated herein by reference.

BACKGROUND

The present invention relates to a method and structure for forming two or more separate heat sinks on a single module in an arrangement having a heat sink within a heat sink (or nested heat sinks) and with each heat sink respectively coupled to each of a plurality of devices (die, socket) having different heights.

Modern electronic components typically include numerous circuits operating at high speed and generating substantial heat. In many applications, it is desirable to employ one or more heat sinks to remove heat from the electronic heat-generating components, such as central processing units (CPUs), etc., to assure that the components function properly and reliably. A heat sink is a passive heat exchanger that cools the device by dissipating heat into the surrounding medium. A typical heat sink comprises a base for contacting with the heat-generating component to absorb the heat originated from the heat-generating component and a plurality of parallel planar fins attached to the base. The fins are used for dissipating the heat to ambient air.

With the development of various types of electronic modules, an array of many discrete components may be mounted to a surface of a single circuit board, a substrate, or a chip carrier package. In some circumstances, more than one of the components must be cooled. Since the components are generally of different heights and their top surfaces are thus at different levels, conventional heat sinks can not meet the requirement to intimately contact with the top surfaces of the components simultaneously to remove the heat from all the components. Thus, more than one of individual heat sinks needs to be employed to remove heat from each component. Accordingly, a large amount of space is required to install the heat sinks, thus restricting space for other components; furthermore, it is both expensive and time-consuming to attach individual heat sinks to each component.

SUMMARY

For a reliable and good thermal contact, the heat sink attachment to certain modules mounted on a socket requires extra hardware resulting in a larger and thicker laminate size. Such attachment may also require holes in the laminate for the extra hardware, which may result in removal of some BGA balls and wiring channels in the laminate layers.

According to an embodiment of the present invention, a first heat sink comprises a first base and fins extending from the first base. The first base comprises a cutout therein and a first base bottom surface contacting a first electronic component. A second heat sink comprises a second base and fins extending from the second base. The second heat sink is located in the cutout of the first heat sink. The second base comprises a second base bottom surface contacting a second electronic component. A pressure plate is attached to the first heat sink and overlays the second heat sink. The pressure plate contacts the second heat sink and applies pressure between the second heat sink and the second electronic component.

According to an embodiment of the present invention, a substrate is mounted on a printed circuit board. A first electronic component is on the substrate. The first electronic component is electrically connected to the substrate. The structure includes a first heat sink comprising a first base and fins extending from the first base. The first base comprises a cutout therein and a first base bottom surface contacting the first electronic component. A second electronic component is on the same substrate. The second electronic component is electrically connected to the substrate. The structure includes a second heat sink comprising a second base and fins extending from the second base. The second heat sink is located in the cutout of the first heat sink. The second base comprises a second base bottom surface contacting the second electronic component. A pressure plate is attached to the first heat sink and overlays the second heat sink. The pressure plate contacts the second heat sink and applies pressure between the second heat sink and the second electronic component.

According to an embodiment of the present invention, a platform having a top surface and a bottom surface is provided. The platform may comprise a printed circuit board, a substrate, or a chip carrier package. A first electronic component is mounted on the top surface of the platform. A second electronic component is mounted on the top surface of the platform. A first heat sink having a first bottom surface contacting the first electronic component and a cutout therein is provided. The second electronic component is located in the cutout. A second heat sink having a second bottom surface contacting the second electronic component in the cutout of the first heat sink is provided. The second heat sink is shorter than the first heat sink relative to the printed circuit board. A pressure plate is attached to the first heat sink. The pressure plate contacts the second heat sink and applies pressure between the second heat sink and the second electronic component.

DETAILED DESCRIPTION

Aspects of the invention will now be described with reference to a heat sink assembly that includes multiple heat sinks mounted on a common printed circuit board. While embodiments of the invention will be described hereinafter in connection with specific embodiments of the invention thereof, it will be understood that limiting the invention to such specific systems and methods is not intended. On the contrary, it is intended to cover all alternatives, modifications, and equivalents as may be included within the spirit and scope of the invention as defined by the appended claims.

For a general understanding of the features of the invention, reference is made to the drawings, which are not necessarily drawn to scale. In the drawings, like reference numerals have been used throughout to identify identical elements.

Figure 1:
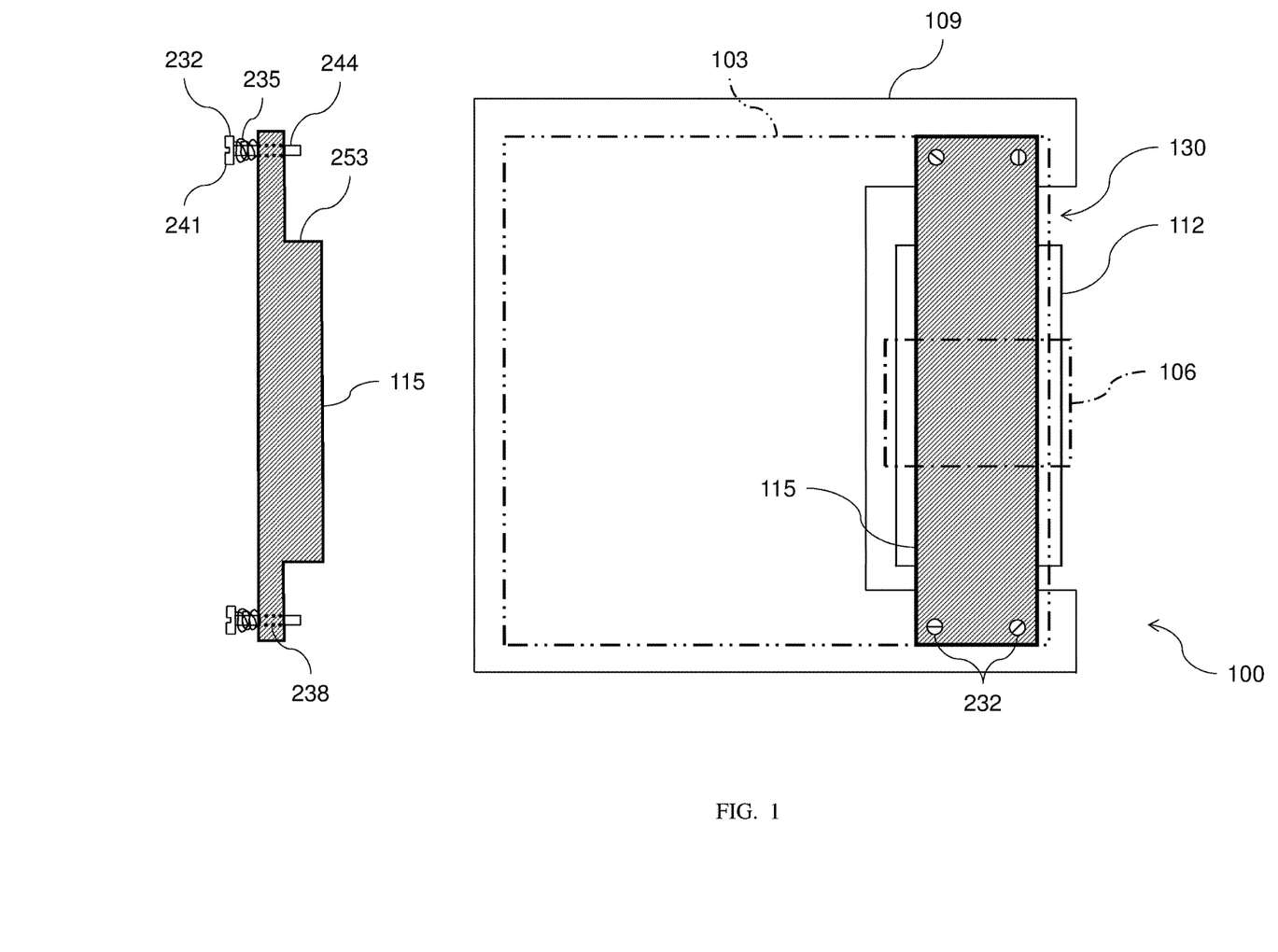
FIG. 1 is a plan view of a heat sink assembly according to embodiments of the present invention.

FIG. 1 shows a plan view of an exemplary heat sink assembly, indicated generally as 100, according to embodiments of the present invention. The heat sink assembly 100 illustrated in this embodiment of the invention is provided for two electronic components, although the concepts disclosed herein apply equally for two or more electronic components. The first electronic component 103 and second electronic component 106 are depicted in broken line outlines, in FIG. 1. The heat sink assembly 100 includes a first heat sink 109 for the first electronic component 103 and a second heat sink 112 for the second electronic component 106. According to embodiments of the present invention, the first heat sink 109 and second heat sink 112 are not attached to each other. A pressure plate 115 is attached to the first heat sink 109 and overlays the second heat sink 112. The pressure plate 115 contacts the second heat sink 112 and applies pressure between the second heat sink 112 and the second electronic component 106.

Figure 2:
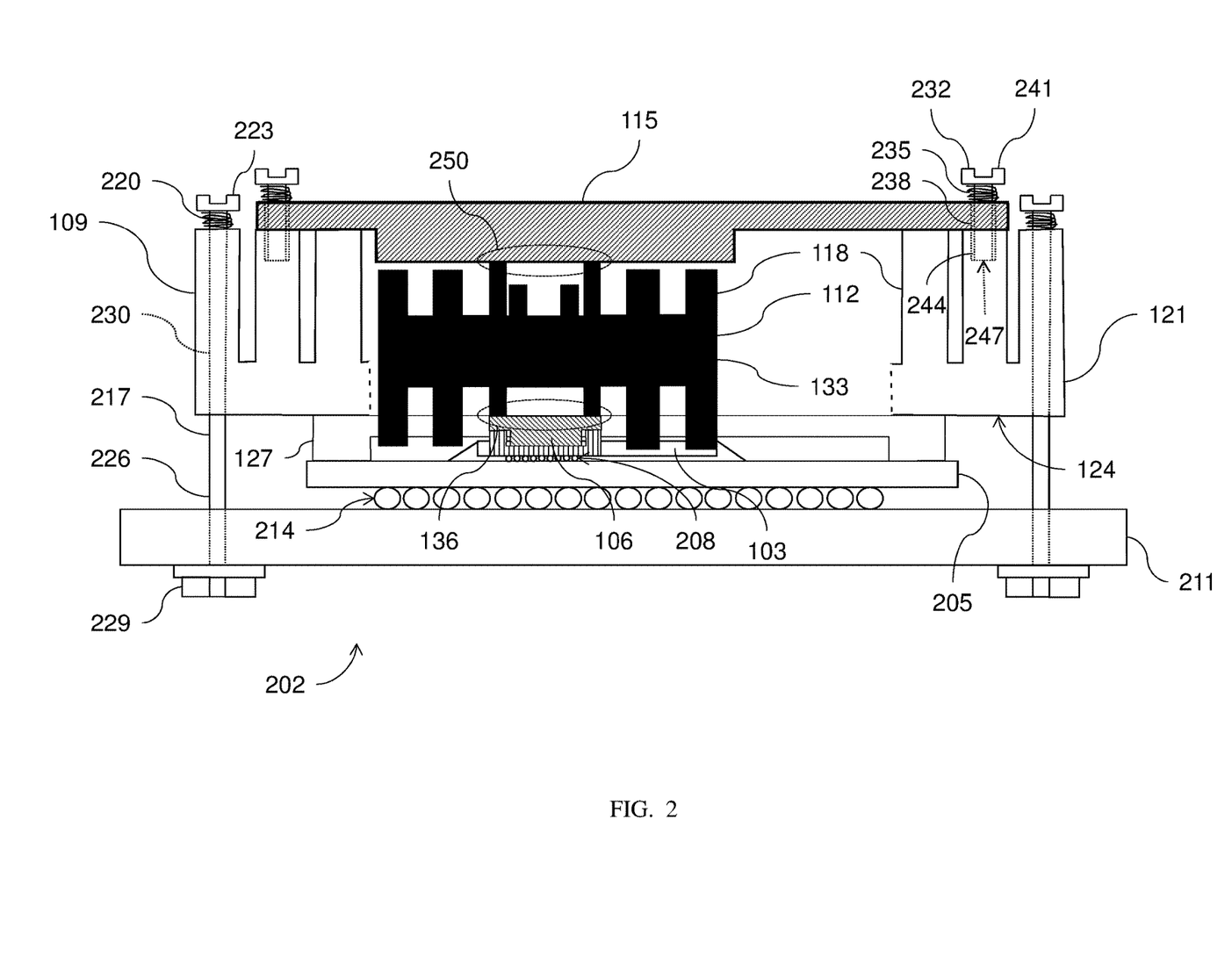
FIG. 2 is a cross-sectional view of a heat sink assembly according to embodiments of the present invention.
Figure 3:
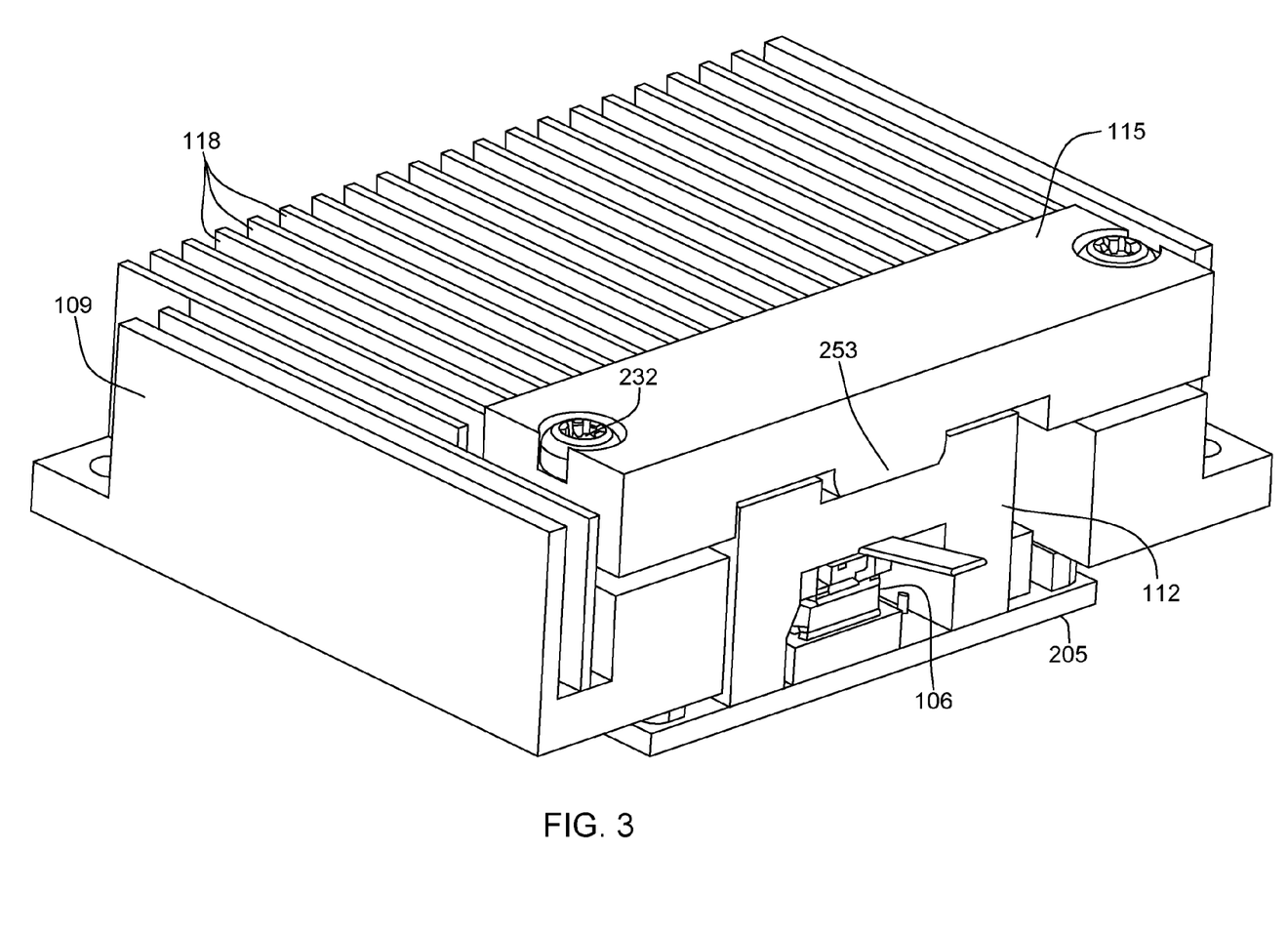
FIG. 3 is a perspective view of a heat sink assembly according to embodiments of the present invention.
Figure 4:
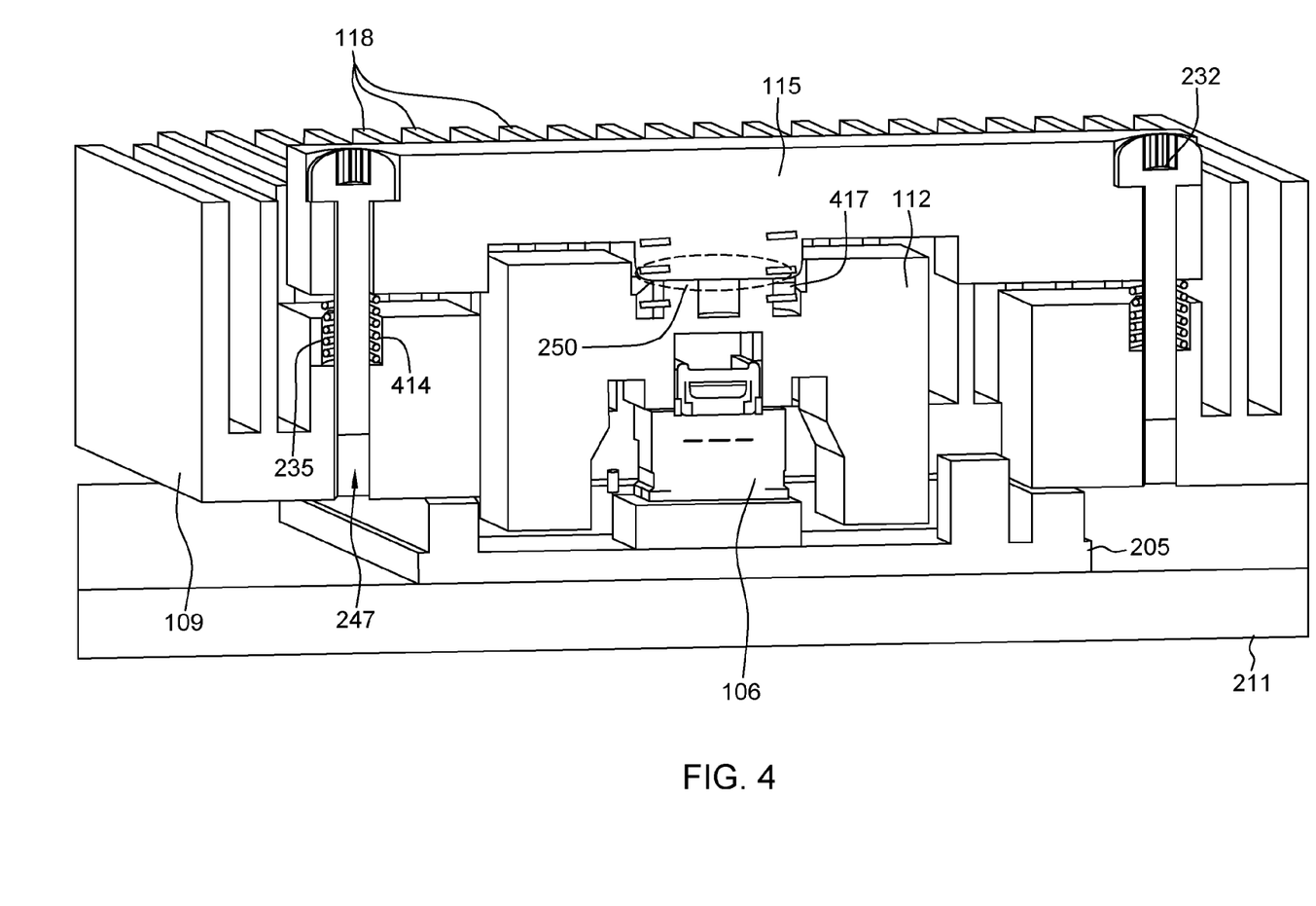
FIG. 4 is an isometric cross-sectional view of a heat sink assembly according to embodiments of the present invention.

Both of the first heat sink 109 and second heat sink 112 are made of a thermally conductive metal, such as aluminum, copper, etc., including alloys thereof. As shown in FIGS. 2-4, the heat sinks 109, 112 comprise fins 118. In a typical configuration, the fins 118 are oriented parallel to each other and spaced with a predetermined distance from adjacent fins. In some cases, however, the fins 118 may be flared and/or pin shaped, as is known in the art. The height and width of the fins 118 may be selected based on thermal cooling efficiency. That is, the shape of the fins 118 can be optimized to maximize the heat transfer density in relation to the space and the materials used for the finned surfaces.

The first heat sink 109 has a first base 121 that includes a first base bottom surface 124. The first base bottom surface 124 contacts the first electronic component 103. In some cases, a lid, such as 127, may cover the first electronic component 103 and the first base bottom surface 124 may be disposed on the lid 127. It is contemplated that thermal interface material (not shown) may be used between the first electronic component 103 and the lid 127 and/or between the lid 127 and the first heat sink 109. The fins 118 of the first heat sink 109 extend from the first base 121. The fins 118 of the first heat sink 109 may be perpendicular to the first base 121. The first base 121 defines at least one cutout, such as indicated at 130. Further, the second electronic component 106 and the second heat sink 112 are located in the cutout 130 of the first heat sink 109. The cutout 130 in the first heat sink 109 can be in various shapes corresponding to the size, shape, and number of the second electronic component(s) 106 and the second heat sink(s) 112. The lid 127 may also include a cutout corresponding to the shape of the cutout 130 of the first heat sink 109.

The second heat sink 112 has a second base 133. The fins 118 of the second heat sink 112 extend from the second base 133. The fins 118 of the second heat sink 112 may be perpendicular to the second base 133. As shown in FIG. 2, the fins 118 of the second heat sink 112 may extend from the top and bottom of the second base 133. Alternatively, the fins 118 of the second heat sink 112 may extend from only either the top or bottom of the second base 133. The second heat sink 112 includes a second base bottom surface 136 that contacts the second electronic component 106. It is contemplated that thermal interface material (not shown) may be used between the second electronic component 106 and the second heat sink 112. In some cases, the second electronic component 106 may have a cover (not shown) and the second base bottom surface 136 may be disposed on the cover. Thermal interface material may be used between the second electronic component 106 and the cover and/or between the cover and the second heat sink 112.

FIG. 2 is a cross-section view of a typically packaged electronic device, indicated generally as 202. The electronic device 202, in the example, includes a laminate substrate 205 with the first electronic component 103 mounted on the laminate substrate 205. Mounting of the first electronic component 103 may be done with a plurality of electrically conductive circuit members 208 positioned on a surface of the laminate substrate 205. The electrically conductive circuit members 208 may include controlled collapse chip connectors (C4s) or other devices known in the art. The second electronic component 106 may also be mounted on the laminate substrate 205. As with the first electronic component 103, mounting of the second electronic component 106 may be done with a plurality of electrically conductive circuit members 208 positioned on the surface of the laminate substrate 205. As described above, the electronic device 202 may include multiple electronic devices having various heights relative to the laminate substrate 205. The laminate substrate 205 may be mounted onto a printed circuit board 211 by means of a ball grid array 214 or other means known in the art. As shown in FIG. 2, the ball grid array 214 is located between a top surface of the printed circuit board 211 and the bottom surface of the laminate substrate 205. The printed circuit board 211 provides module to module interconnect plus access to Input/Output devices.

The first heat sink 109 is mounted on the first electronic component 103 and attached to the printed circuit board 211. In FIG. 2, the first heat sink 109 for the first electronic component 103 is only partially shown to avoid clutter. Additionally, in FIG. 2, the first heat sink 109 is shown contacting the lid 127. Other configurations can be used. According to device and methods herein, the first heat sink 109 may be attached to the printed circuit board 211 using fasteners 217 and biasing elements 220, which may comprise springs, bands, gas pistons, arched elements, or other biasing elements as would be known by one skilled in the art. Each of the fasteners 217 has a head 223 at one end thereof and an elongated shaft 226 extending axially from the head 223. The elongated shaft 226 is received in a retainer 229 at an end opposite from the head 223. The retainer 229 may comprise a threaded nut or other appropriate device known in the art. The elongated shaft 226 may be threaded for this purpose. The biasing elements 220 may be concentrically disposed over the elongated shaft 226. As shown in FIG. 2, the first heat sink 109 may include openings 230 extending from the top surface to the bottom surface of one or more of the fins 118 for receiving the fasteners 217 in order to mount the first heat sink 109 onto the printed circuit board 211. The biasing elements 220 closely encircle a portion of the elongated shaft 226 and are held between the head 223 and the top surface of the fin 118.

The second heat sink 112 is mounted on the second electronic component 106. According to embodiments of the present invention, the second heat sink 112 is not attached to the first heat sink 109. Instead, the pressure plate 115 spans the cutout 130 in the first heat sink 109 and overlays the second heat sink 112. The pressure plate 115 applies pressure between the second heat sink 112 and the second electronic component 106, as shown in FIG. 3. According to embodiments of the present invention, the pressure plate 115 may be attached to the first heat sink 109 using fasteners 232 and compression elements 235, which may comprise springs, bands, gas pistons, arched elements, or other compression elements as would be known by one skilled in the art. The pressure plate 115 includes openings 238 extending from the top surface to the bottom surface of the pressure plate 115. Each of the fasteners 232 has a head 241 at one end thereof and a shaft 244 extending axially from the head 241, as also shown in FIG. 1. The shaft 244 is received in a mounting hole 247 in one or more of the fins 118 in the first heat sink 109. The shaft 244 and mounting hole 247 may be threaded for this purpose, as is known in the art. The compression elements 235 may be concentrically disposed over the shaft 244. The compression elements 235 closely encircle a portion of the shaft 244 and may be held between the head 241 and the top surface of the pressure plate 115. As shown in FIG. 4, the compression elements 235 may be held between the bottom surface of the pressure plate 115 and the first heat sink 109. Cavities, such as 414, may be provided for this purpose. With such compression elements 235, the pressure plate 115 and/or the second heat sink 112 may be movable relative to the first heat sink 109 along a direction perpendicular to the first base bottom surface 124 of the first heat sink 109, which allows for thermal expansion of the second heat sink 112.

The pressure plate 115 contacts the second heat sink 112, such as shown at 250. The pressure plate 115 may include an extension 253, sized and configured to fit the different heights between the first heat sink 109 and the second heat sink 112. The size, shape, thickness, and other dimensions of the pressure plate 115 can be modified as deemed necessary, according to the relative heights of the first heat sink 109 and the second heat sink(s) 112. Additionally, as shown in FIG. 4, compression elements 417 may be disposed between the bottom surface of the pressure plate 115 and the top of the second heat sink 112. The compression elements 417 may comprise springs, bands, gas pistons, arched elements, or other compression elements as would be known by one skilled in the art. With such compression elements 417, the second heat sink 112 may be movable relative to the first heat sink 109 along a direction perpendicular to the first base bottom surface 124 of the first heat sink 109, which allows for thermal expansion of the second heat sink 112.

It is not always necessary to attach the first heat sink 109 to the printed circuit board 211, as shown in FIG. 2. In some cases, the first heat sink 109 can be firmly attached directly to the first electronic component 103 by epoxy or other means that provides enough mechanical strength to secure the first heat sink 109 firmly onto the first electronic component 103. In such a case, the pressure plate 115 attached to the first heat sink 109 still contacts the second heat sink 112 and applies pressure between the second heat sink 112 and the second electronic component 106.

According to embodiments of the present invention, the structure includes two or more separate heat sinks attachment for two or more devices (die and or socket) with different heights on a single platform, such as a printed circuit board, substrate, chip carrier module, or other similar module. While the examples illustrated in the drawings show the first heat sink 109 being relatively taller than the second heat sink 112, it is contemplated that the second heat sink 112 can be taller than the first heat sink 109. In that case, the pressure plate 115 may have a custom shape, according to the size, shape, and number of the second heat sink(s) 112. Aspects of this invention utilize a pressure plate supported on the main or bigger heat sink and that creates pressure onto the smaller heat sink to contact another device (chip or chip mounted on or in a socket).

Figure 5:
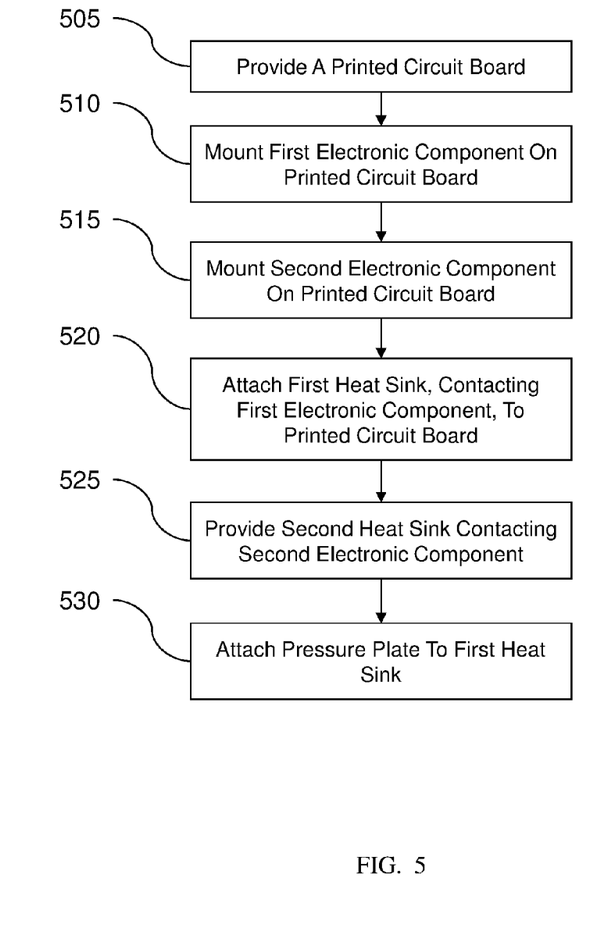
FIG. 5 is a flow diagram illustrating methods herein.

FIG. 5 is a flow diagram illustrating the processing flow of an exemplary method of fabricating an electronic package incorporating multiple heat sinks according to embodiments of the present invention. In item 505, a printed circuit board having a top surface and a bottom surface is provided. A first electronic component is mounted on the top surface of the printed circuit board, at 510. A second electronic component is mounted on the top surface of the printed circuit board, at 515. The first electronic component is shorter than the second electronic component relative to the printed circuit board. A first heat sink is attached to the printed circuit board, at 520. The first heat sink has a first bottom surface contacting the first electronic component and a cutout therein. The second electronic component is located in the cutout. At 525, a second heat sink having a second bottom surface contacting the second electronic component in the cutout of the first heat sink is provided. The second heat sink is shorter than the first heat sink relative to the printed circuit board. At 530, a pressure plate is attached to the first heat sink. The pressure plate contacts the second heat sink and applies pressure between the second heat sink and the second electronic component.

Flip chip is a method for interconnecting semiconductor devices, such as IC chips, to external circuitry with solder bumps that have been deposited onto the chip pads. The solder bumps are deposited on the chip pads on the top of the wafer during the final wafer processing step. In order to mount the chip to external circuitry (e.g., a circuit board or another chip or wafer), it is flipped over so that its top side faces down, and aligned so that its pads align with matching pads on the external circuit, and then the solder is flowed to complete the interconnect. This is in contrast to wire bonding, in which the chip is mounted upright, and wires are used to interconnect the chip pads to external circuitry.

The terminology used herein is for the purpose of describing particular embodiments of the invention only and is not intended to be limiting of this invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device comprising:
   a first heat sink comprising a first base having a first base bottom surface contacting a first electronic component, said first heat sink having at least one cutout therein;
   a second heat sink separate from said first heat sink, said second heat sink comprising a second base having a second base bottom surface contacting a second electronic component, said second electronic component being separate from said first electronic component, said second heat sink and said second electronic component being located in said at least one cutout of said first heat sink and not contacting said first heat sink; and
   a pressure plate attached to said first heat sink and overlaying said second heat sink, said pressure plate contacting said second heat sink and being positioned to apply pressure between said second heat sink and said second electronic component and to enable movement between said pressure plate and said first heat sink.

2. The device according to claim 1, further comprising:
   a platform, said first electronic component and said second electronic component being connected to said platform, said platform comprising one of a printed circuit board, a substrate, and a chip carrier package.

3. The device according to claim 2, said first heat sink being attached to said platform.

4. The device according to claim 2, said first heat sink comprising openings extending from a top surface of said first heat sink to said first base bottom surface of said first heat sink, said device further comprising:
   fasteners penetrating said openings in said first heat sink and attached to said platform, said fasteners comprising a shaft and biasing elements surrounding a portion of said shaft to enable movement between said first heat sink and said platform.

5. The device according to claim 1, said first heat sink being attached to said first electronic component.

6. The device according to claim 1, said first heat sink further comprising first fins extending from said first base, said first fins extending from said first base being perpendicular to said first base, and
   said second heat sink further comprising second fins extending from said second base, said second fins extending from said second base being perpendicular to said second base.

7. The device according to claim 1, said pressure plate comprising openings extending from a top surface of said pressure plate to a bottom surface of said pressure plate, said device further comprising:
   fasteners penetrating said openings and attached to said first heat sink, said fasteners comprising a shaft and compression elements surrounding said shaft.

8. The device according to claim 1, said second heat sink being movable relative to said first heat sink along a direction perpendicular to said first base bottom surface of said first heat sink.

9. A structure comprising:
   a platform comprising one of a printed circuit board, a substrate, and a chip carrier package;
   a substrate mounted on said platform;
   a first electronic component on said substrate, said first electronic component being electrically connected to said substrate;
   a first heat sink comprising a first base having a first base bottom surface contacting said first electronic component, said first heat sink having at least one cutout therein;
   a second electronic component on said substrate, said second electronic component being electrically connected to said substrate, said second electronic component being separate from said first electronic component;
   a second heat sink separate from said first heat sink, said second heat sink comprising a second base having a second base bottom surface contacting said second electronic component, said second heat sink and said second electronic component being located in said at least one cutout of said first heat sink and not contacting said first heat sink; and
   a pressure plate attached to said first heat sink and overlaying said second heat sink, said pressure plate contacting said second heat sink and being positioned to apply pressure between said second heat sink and said second electronic component and to enable movement between said pressure plate and said first heat sink.

10. The structure according to claim 9, said first heat sink comprising openings extending from a top surface of said first heat sink to a bottom surface of said first heat sink, said structure further comprising:
    fasteners penetrating said openings in said first heat sink and attached to said platform, said fasteners comprising a shaft and biasing elements surrounding a portion of said shaft to enable movement between said first heat sink and said platform.

11. The structure according to claim 9, said first heat sink being attached to said first electronic component.

12. The structure according to claim 9, said first heat sink further comprising first fins extending from said first base, said first fins extending from said first base being perpendicular to said first base, and
    said second heat sink further comprising second fins extending from said second base, said second fins extending from said second base being perpendicular to said second base.

13. The structure according to claim 9, said pressure plate comprising openings extending from a top surface of said pressure plate to a bottom surface of said pressure plate, said structure further comprising:
    fasteners penetrating said openings and attached to said first heat sink, said fasteners comprising a shaft and compression elements surrounding said shaft.

14. The structure according to claim 9, said second heat sink being movable relative to said first heat sink along a direction perpendicular to said first base bottom surface of said first heat sink.

15. A method comprising:
    providing a platform having a top surface and a bottom surface, said platform comprising one of a printed circuit board, a substrate, and a chip carrier package;
    mounting a first electronic component on said top surface of said platform;
    mounting a second electronic component on said top surface of said platform, said second electronic component being separate from said first electronic component;

providing a first heat sink, said first heat sink having a first bottom surface contacting said first electronic component and said first heat sink having a cutout therein, said second electronic component being located in said cutout;

providing a second heat sink separate from said first heat sink, said second heat sink having a second bottom surface contacting said second electronic component in said cutout of said first heat sink, said second heat sink not contacting said first heat sink; and attaching a pressure plate to said first heat sink, said pressure plate contacting said second heat sink and being positioned to apply pressure between said second heat sink and said second electronic component and to enable movement between said pressure plate and said first heat sink.

16. The method according to claim 15, said first heat sink comprising a first base comprising first fins extending perpendicular from said first base, and said second heat sink comprising a second base comprising second fins extending perpendicular from said second base.

17. The method according to claim 15, said first heat sink comprising openings extending from a top surface of said first heat sink to said first bottom surface of said first heat sink, said method further comprising:

attaching said first heat sink to said platform by fasteners penetrating said openings, said fasteners comprising a shaft and biasing elements surrounding a portion of said shaft.

18. The method according to claim 15, said pressure plate comprising openings extending from a top surface of said pressure plate to a bottom surface of said pressure plate, said method further comprising:

attaching said pressure plate to said first heat sink by fasteners penetrating said openings, said fasteners comprising a shaft and compression elements surrounding said shaft.

19. The method according to claim 15, further comprising:

attaching said first heat sink to said first electronic component.

20. The method according to claim 15, said second heat sink being movable relative to said first heat sink along a direction perpendicular to said first bottom surface of said first heat sink.

* * * * *